United States Patent [19]

Kurashita et al.

[11] Patent Number: 4,924,429

[45] Date of Patent: May 8, 1990

[54] HARDWARE LOGIC SIMULATOR

[75] Inventors: Masahiro Kurashita; Nobuyoshi Nomizu, both of Tokyo, Japan

[73] Assignee: NEC Corporation, Tokyo, Japan

[21] Appl. No.: 159,741

[22] Filed: Feb. 24, 1988

[30] Foreign Application Priority Data

Feb. 25, 1987 [JP] Japan .................................. 62-40343
Apr. 23, 1987 [JP] Japan ................................ 62-100287

[51] Int. Cl.[5] ........................ G06F 9/44; G06F 12/00; G01R 31/28
[52] U.S. Cl. ................................... 364/578; 364/200; 364/221.2; 364/900; 364/916.3; 371/23
[58] Field of Search ................. 364/578, 221.2, 916.3; 371/23

[56] References Cited

U.S. PATENT DOCUMENTS

| | | | |
|---|---|---|---|
| 4,697,241 | 9/1987 | Lavi ..................................... | 364/900 |
| 4,725,970 | 2/1988 | Burrows et al. ..................... | 364/578 |
| 4,736,338 | 4/1988 | Saxe et al. ........................... | 364/900 |
| 4,782,440 | 11/1988 | Nomizu et al. ..................... | 364/900 |
| 4,787,061 | 11/1988 | Nei et al. ............................. | 364/900 |

FOREIGN PATENT DOCUMENTS 216340 1/1984 Fed. Rep. of Germany ...... 364/578
61-184471 2/1985 Japan .................................. 364/578

OTHER PUBLICATIONS

Takasaki et al., "HAL II: A Mixed Level Hardware Simulation System," 1986, IEEE 23rd Design Automation Conference, pp. 581-587.

Primary Examiner—Felix D. Gruber
Attorney, Agent, or Firm—Foley & Lardner, Schwartz, Jeffery, Schwaab, Mack, Blumenthal & Evans

[57] ABSTRACT

A hardware logic simulator includes a first memory, having memory locations respectively corresponding to a plurality of signals in a logic circuit to be simulated, for storing data representing states of the plurality of signals, and a second memory having memory locations respectively corresponding to those of the first memory and an address bus common therewith. When the content of a memory location at a given address of the first memory is changed during simulation, data representing the change in state of the corresponding signal is written in a second memory location corresponding to the given address. The content of the second memory is read out at the end of the simulation and the degree of completeness of the simulation is evaluated.

6 Claims, 5 Drawing Sheets

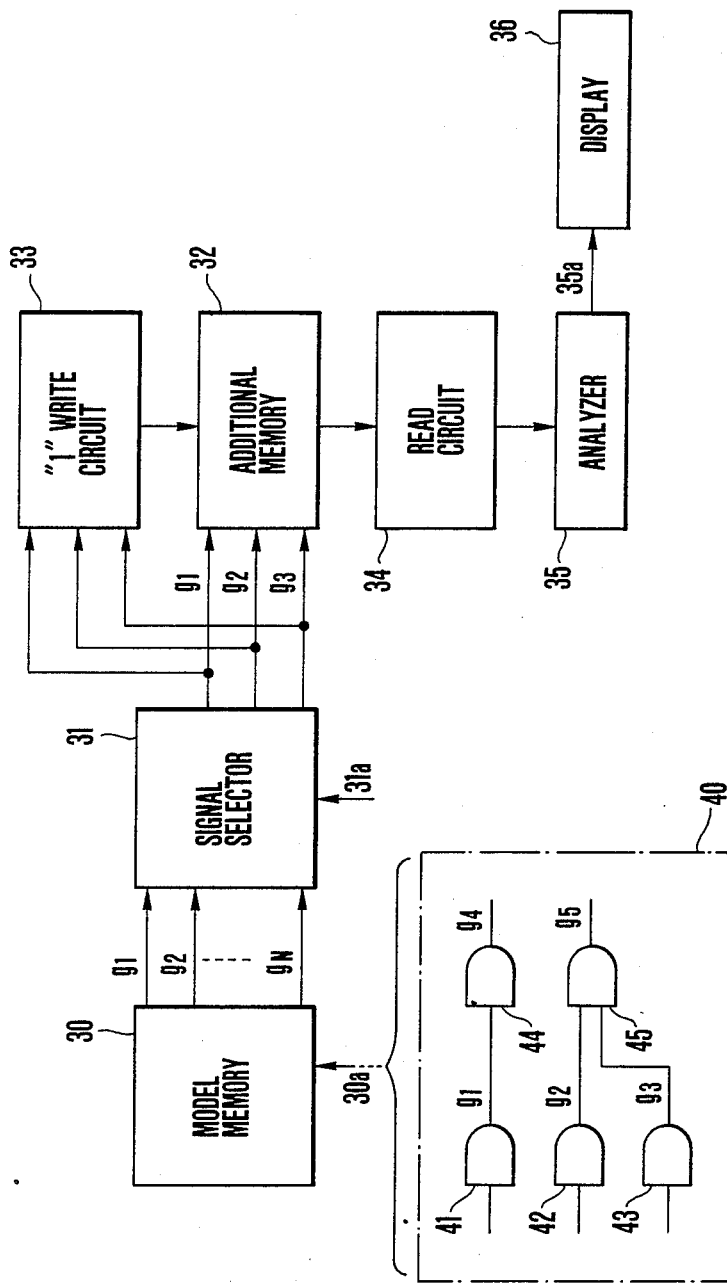

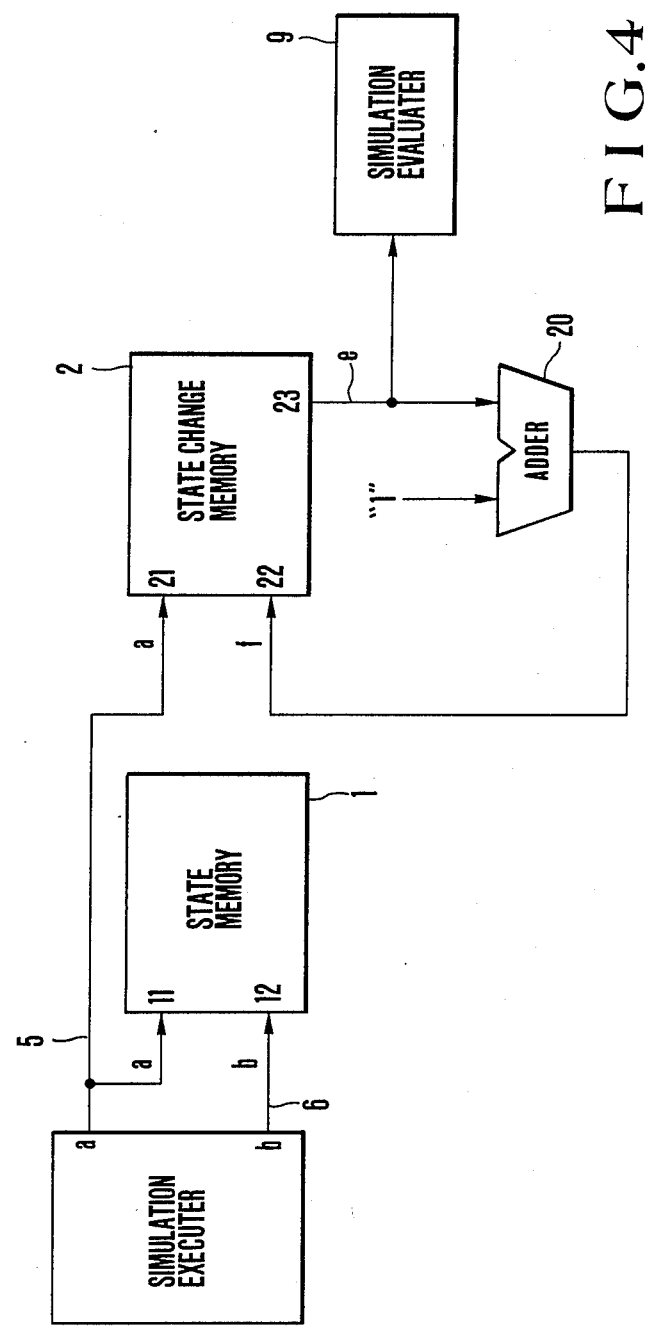
F I G. 4

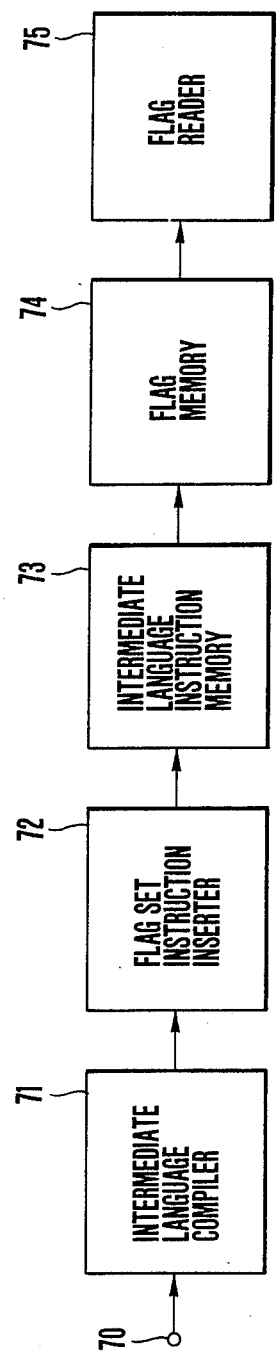
F I G. 6

HARDWARE LOGIC SIMULATOR

BACKGROUND OF THE INVENTION

The present invention relates to a hardware logic simulator.

Conventional software logic simulators operated by computer programs have been used to examine the design of logic circuits each comprising a large number of logic gates.

In recent years, various types of hardware logic simulators have been proposed in place of software logic simulators since software logic simulators require a long simulation execution time and a large volume of test data relating to the design of a logic circuit such as a large scale integrated circuit (LSI) including numerous gates.

A hardware logic simulator generally comprises a memory for creating a simulation model including types of gates included in a logic circuit to be simulated, connections between the gates, and latest states of output signals from the gates, and a simulation execution section for causing the simulation model to perform logic operations using test data corresponding to various test cases.

One of the measures for the quality of simulation is the degree of completeness of simulation, i.e., the degree of simulation capable of effectively executing all cases which may occur in actual operations of the logic circuit as an objective for simulation within a short period of time and a small number of operation steps.

It is actually difficult to check the completeness of simulation in, especially, an LSI hardware logic simulator. As a result, the number of cases tested is often too small and logical errors are found after the fabrication of LSIs. In addition, identical test cases are often repeatedly tested, thus wasting effort.

SUMMARY OF THE INVENTION

It is an object of the present invention to provide a hardware logic simulator capable of eliminating the conventional drawbacks described above and easily checking the completeness of simulation.

A hardware logic simulator for performing a simulation of a logic circuit including a plurality of signals according to the present invention, comprises: a first memory for storing data at memory locations respectively corresponding to the plurality of signals, the first memory data representing states of the plurality of signals; a second memory having memory locations corresponding to those of the first memory and connected to the first memory through a common address bus, the second memory being arranged to store data at a memory location thereof corresponding to a given first memory location when the given first memory location is accessed during simulation, the second memory data representing state changes in the plurality of signals; and means for reading out contents at addresses of the second memory after the simulation is completed and for evaluating a degree of completeness of the simulation.

BRIEF DESCRIPTION OF THE DRAWINGS

FIG. 2 is a block diagram of a hardware logic simulator according to another embodiment of the present invention;

FIG. 3 is a circuit diagram showing a logic circuit to be simulated in order to explain the operation of the simulator shown in FIG. 2;

FIG. 4 is a block diagram of a hardware logic simulator according to still another embodiment of the present invention;

FIG. 6 is a block diagram of a hardware logic simulator according to still another embodiment of the present invention.

DETAILED DESCRIPTION OF THE PREFERRED EMBODIMENTS

Preferred embodiments of the present invention will be described in detail with reference to the accompanying drawings.

Figure 1:
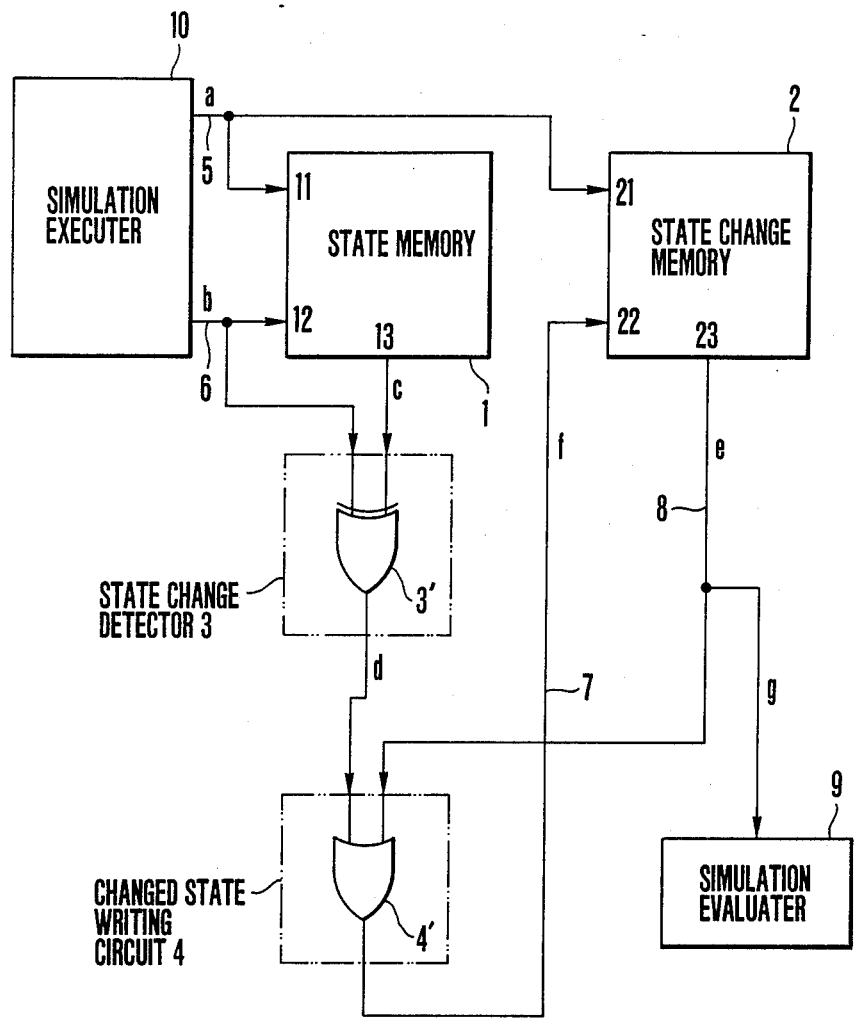
FIG. 1 is a block diagram of a hardware logic simulator according to an embodiment of the present invention.

FIG. 1 is a block diagram of a hardware logic simulator according to an embodiment of the present invention. Referring to FIG. 1, a state memory 1 stores states of signals (e.g., output signals) from gates in a logic circuit to be simulated. The states of the signals are logic "1" or logic "0", and the state memory data are stored at memory locations respectively corresponding to the signals. Each memory location is addressed in response to an address signal a supplied from a simulation executer 10 to an address terminal 11 through an address bus 5. A data input terminal 12 of the state memory 1 receives data b from the simulation executer 10 through a data bus 6. The data b represents a latest state of the signal to be stored at a memory location addressed by the address signal a. The content of the memory location addressed by the address signal a, that is, data c representing the previous state of the signal, is output from a data output terminal 13 before the data b is input.

The address bus 5 is connected to an address terminal 21 of a state change memory 2. The state change memory 2 has memory locations corresponding to those of the state memory 1 in one-to-one correspondence. Data e is read out from a memory location addressed by the address signal a supplied to the address terminal 21 and is output from an output terminal 23 through a data bus 8. Data f input to the data input terminal 22 through a data bus 7 is stored in a memory location from which the data e is read out.

A state change detector 3 receives the input data b to the state memory 1 and the output data c from the state memory 1. If these data are different from each other, the state change detector 3 discriminates a change in state of the signal, and outputs a flag d representing the change in signal state. The state change detector 3 uses, e.g., an exclusive OR gate 3', and the flag representing the change in signal state is set at "1" upon detection of this change.

A changed state writing circuit 4 receives the flag d output from the state change detector 3 and the data e output from the state change memory 2. If one or both of the data are data representing the change in signal state, data f representing the change in signal state is written in the state change memory 2. The changed state writing circuit 4 comprises, e.g., an OR gate 4'.

After each simulation is completed, the contents of the memory locations of the state change memory 2 are read out as data g and are supplied to a simulation evaluator 9. The simulation evaluator 9 evaluates the degree of completeness of the simulation.

The operation of the circuit in FIG. 1 will be described below when the state change detector 3 comprises an exclusive OR gate 3' and the changed state writing circuit 4 comprises an OR gate 4'.

During the simulation, the address a representing each signal of the simulation model and data 6 representing the latest state of this signal are supplied from the simulation executer 10 to the state memory 1.

During the simulation, the address a is updated, and the content of the memory location addressed by the updated address a is updated. In this case, before the new data b is written in the memory location addressed by the address signal a, the state memory 1 outputs to the output terminal 13 the data c representing the previous state of the signal from this memory location. At the same time, the state change memory 2 reads out the data from the memory location addressed by the address signal a and supplies the readout data to the OR gate 4'.

The exclusive OR gate 3' calculates an exclusive OR product of the latest state data b and the previous state data c. If the data b is detected to be different from the data c, the state change flag d of logic "1" is output. The flag d of logic "1" is transmitted through the OR gate 4' and the line 7 is written in the memory location at the address a in the state change memory 2.

If the content of the memory location at the address a of the state change memory 2 is already logic "1", the data is read out and transmitted through the line 8 and the OR gate 4'. The readout data is supplied to the data input terminal 22 of the state change memory 2. The content of the memory location is kept unchanged once data of "1" is written therein.

The state change memory 2 stores the data representing the presence/absence of changes in states of all signals used in the logic circuit to be simulated.

When the simulation is completed, the contents of the state change memory 2 are read out by the simulation evaluator 9. The simulation evaluator evaluates the degree of completeness of the simulation.

FIG. 2 is a block diagram of a hardware logic simulator according to another embodiment of the present invention. Referring to FIG. 2, a model memory 30 stores a simulation model of a logic circuit to be simulated. A signal selector 31 selects a set of specific one of the signals in the simulation models.

An additional memory 32 includes a plurality of memory locations addressable by combinations of the set of signals selected by the signal selector 31. The additional memory 32 is added to the model memory 30 to constitute a simulation model. A "1" write circuit 33 writes data of "1" to a memory location corresponding to an updated address determined by the combination of the set of signals in the additional memory 32 during the simulation. Reference numeral 34 denotes a read circuit for reading data from the additional memory 34; 35, an analyzer for extracting signals corresponding to address bits "0" of the readout data; and 36, a display for displaying an output from the analyzer 35.

The operation of the simulator shown in FIG. 2 will be described below. For illustrative convenience, a logic circuit 40 comprising AND gates 41, 42, 43, 44, and 45 for respectively outputting signals g1, g2, g3, g4, and g5, as shown in FIG. 3, will be simulated.

A circuit descriptor 30a for describing the logic circuit 40 (FIG. 3) to be simulated is input to the model memory 30, so that a prototype of the simulation model is created in the model memory 30. The created simulation model stores data representing the states of the signals g1 to g5 from the gates 41 to 45, respectively, in the logic circuit 40. Of these signals g1 to g5, signals g1, g2, and g3 are selected in accordance with the signal set designation descriptor 31a supplied to the signal selector 31. The additional memory 32 is addressed with the selected signal set. The additional memory 32 provides storage in addition to that for the simulation model created in the model memory 30, thereby constituting the simulation model for executing the simulation. In other words, when the signals g1, g2, and g3 are selected, the additional memory 32 requires eight memory locations. Prior to the execution of the simulation, the memory locations of the additional memory 32 which correspond to the addresses are cleared to logic "0". A simulation is performed by a simulation executer (not shown) by applying the simulation model including the additional memory 32 to test cases. In this case, every time the states of the set of address signals g1, g2, and g3 input to the additional memory 32 are changed, the "1" write circuit 33 writes predetermined data, e.g., logic "1" at the corresponding address of the additional memory 32 which is determined by the changed state of the set of signals. The added memory data in the memory 32 is read out by the read circuit 34 at the end of simulation. The readout data is analyzed by the analyzer 35. The address bit "0" is analyzed as the nonaccessed address, i.e., a non-realized state of the set of signals g1, g2, and g3. An analysis result 35a is displayed on the display 36.

In the next simulation, the non-realized combination is taken into consideration to create test cases. Therefore, identical test cases need not be repeatedly tested, and efficient simulation can be performed so as to efficiently perform logical tests.

FIG. 4 is a block diagram showing still another embodiment of the present invention. The same reference numerals as in FIG. 1 denote the same parts in FIG. 4, and a detailed description thereof will be omitted.

Referring to FIG. 4, an output terminal 23 of a state change memory 2 is connected to one input terminal of an adder 20. The other input terminal of the adder 20 always receives logic "1". The adder 20 adds the inputs and outputs a sum to a data input terminal 22 of the state change memory 2.

With the above arrangement, whenever the memory location at the address a of the state change memory 2 is accessed during the simulation, the content of the memory location at the address a is incremented by one.

At the end of simulation, the content of each memory location of the state change memory 2 is read out and analyzed by the simulation evaluator through a line 9. Signals or gates whose numbers of changes in states in the logic circuit subjected to simulation are less than predetermined numbers can be easily detected, and another simulation can be executed for these signals or gates.

Figure 5:
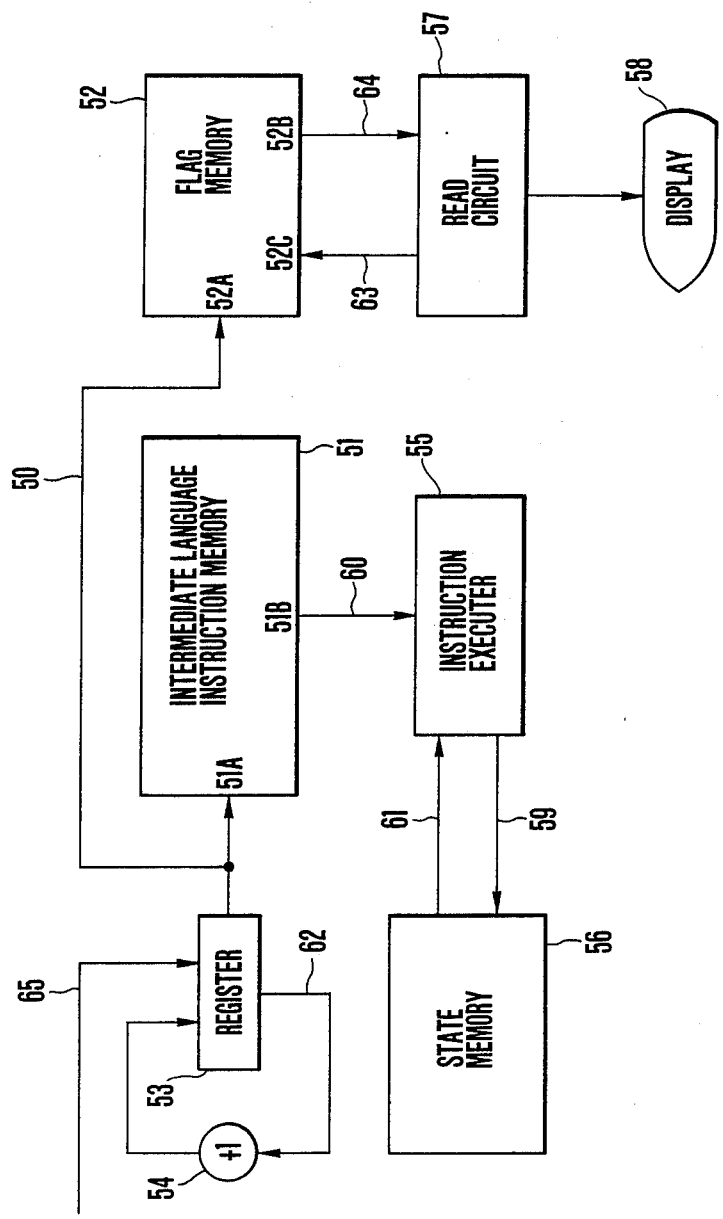
FIG. 5 is a block diagram of a hardware logic simulator according to still another embodiment of the present invention.

FIG. 5 is a block diagram showing still another embodiment of the present invention. A function descriptive language of the logic circuit subjected to a logical simulation is translated into intermediate language instructions in FIG. 5. These intermediate language instructions are stored in an instruction memory 51. An instruction in a memory location corresponding to an address signal input to an address terminal 51A is output from an output terminal 51B in the intermediate language instruction memory 51.

A separate flag memory 52 having memory locations corresponding to the addresses of the intermediate language instruction memory 51 is arranged. A flag, e.g., a flag of logic "1" is set in a memory location at an address of the flag memory 52 so as to correspond to the address signal input to an address terminal 52A from an address bus commonly used with the intermediate language instruction memory 51.

The flag memory 52 has an "anytime" input terminal 52C which receives a request signal from a read circuit 57 through a line 63 and outputs the data from an output terminal 52B to a display 58 through a line 64 and a read circuit 57.

An instruction executer 55 executes logic operations in accordance with the intermediate language instruction read out from the intermediate language instruction memory 51. An operation result is stored in a state memory 56 through a line 59. The state memory 56 is the same as the state memory 1 in FIG. 1. An address bus 50 of the intermediate language instruction memory 51 and the flag memory 52 is connected to a register 53. An output from the register 53 is incremented by one by an incrementer 54 through a line 62, and the incremented value is written in the register 53 again, thereby updating the content of the register 53.

The operation of the circuit shown in FIG. 5 will be described below.

An intermediate language execution start address is supplied to the register 53 through a line 65 and is stored in the register 53. At the same time, this start address is also supplied to the intermediate language instruction memory 51 as an address signal. The intermediate language instruction corresponding to this address signal is read out through the line 60. The readout data is supplied to the instruction executer 55. The instruction executer 55 reads out the data from the state memory 56 through a line 61 in response to the readout instruction and performs a predetermined operation. The operation result is written in the state memory 56 through a line 59. Thus, the execution of one intermediate language instruction is completed.

The content of the register 53 is incremented by one by the incrementer 54. As a result, the address of the intermediate language instruction memory 51 is updated by one, and the above operation is repeated. The instructions are sequentially read out and executed.

Every time the intermediate language instruction is read out, the above operation is repeated. The address of the flag memory 52 is incremented by one, and a flag representing that the instruction has been completed is set at the corresponding address. At the end of simulation, when a read address is supplied from the read circuit 57 to the flag memory 52 through a line 63, the contents of the flag memory 52 can be read out and displayed on the display 58. The non-executed instructions of the intermediate language instructions can be visually checked. Therefore, the degree of completeness of the simulation can be checked, which can be utilized for evaluation of the simulation effect.

FIG. 6 is a block diagram of still another embodiment of the present invention. Referring to FIG. 6, reference numeral 71 denotes a compiler for translating a function descriptor 70 of a logic circuit subjected to a simulation into an intermediate language descriptor; 72, a flag set instruction inserter for inserting a flag set instruction in the intermediate language descriptor; 73, a memory for storing a simulation model consisting of intermediate language instructions including the flag set instruction; 74, a flag memory for setting a memory location corresponding to the flag set instruction when it appears during execution of the simulation; and 75, a flag reader for discriminating whether the flag is set.

The operation of the logic simulator with the above arrangement will be described below. The compiler 71 translates the function descriptor 70 into a intermediate language descriptor, and the translated intermediate language descriptor is stored in the intermediate language instruction memory through the flag set instruction inserter. The flag set instruction inserter 72 inserts a flag set instruction for storing an instruction running state in all branch destinations of all branch instructions of the intermediate language descriptor.

When the simulation model of the intermediate language instruction in which the flag instruction is inserted is executed, the flag, e.g., "1" in the corresponding memory location of the flag memory 74 is set every time a flag set instruction appears.

When the simulation is completed, the contents of the flag memory 74 are read out by the flag reader 75. Therefore, the branch destinations whose branch instructions are not performed can be easily checked, thus effectively measuring to completeness of the simulation.

What is claimed is:

1. A hardware logic simulator for performing a simulator of a logic circuit including a plurality of signals, comprises:

a first memory for storing first memory data at first memory locations respectively corresponding to said plurality of signals, said first memory data representing states of said plurality of signals;

a second memory having second memory locations corresponding to said first memory locations and connected to said first memory through a common address bus, said second memory being arranged to store second memory data at a second memory location thereof corresponding to a given first memory location when said given first memory location is accessed during simulation, said second memory data representing state changes in said plurality of signals; and means or reading out contents at addresses of said second memory after simulation is completed and for evaluating the degree of completeness of simulation.

2. A simulator according to claim 1, wherein said hardware logic simulator further comprises: means for detecting a change in content of a first memory location at a given address of said first memory and providing an output; and writing means for writing data representing a change in state of a signal at a second memory location at an address in said second memory in response to said output from said detecting means, or for receiving a second memory output corresponding to said address and writing data representing a change in state of a signal at said address if said second memory output is data representing a change in the state of a signal.

3. A simulator according to claim 1, wherein said hardware logic simulator further comprises adder means for adding said second memory output corresponding to a given address and logic "1" and writing a sum in a memory location at a given address of said second memory.

4. A hardware logic simulator comprising:

a model memory for storing a simulation model of a logic circuit including a plurality of signals;

means for selecting a set of signals in said simulation model;

an additional memory for receiving said set of signals as an address signal;

means for executing a simulation according to said simulation model including said additional memory;

means for writing predetermined data in a memory location at an address in said additional memory which is determined by a change in state of said set of signals during simulation; and evaluating means for reading out said data from said additional memory and evaluating said simulation using said data readout after said simulation is completed.

5. A hardware logic simulator comprising:

a model memory for storing intermediate language instructions of a simulation model which describes a logic circuit at corresponding addresses thereof;

a flag memory, having addresses common with those of said model memory, for writing a flag in a memory location at an address corresponding to that of said model memory, said flag representing the fact that an intermediate language instruction has been completed; and means for reading out contents of said flag memory after simulation is completed.

6. A simulator according to claim 5, wherein said hardware logic simulator further comprises: means for inserting an instruction for setting flags representing the fact that instructions have been completed in all branch destinations of all branch instructions included in said intermediate language instructions stored in said model memory; and a memory location for storing said flag corresponding to an instruction for setting said flag.

* * * * *